(12) United States Patent
Sommer

(10) Patent No.: US 7,224,214 B2
(45) Date of Patent: May 29, 2007

(54) INTEGRATED CIRCUIT

(75) Inventor: Michael Bernhard Sommer, Raubling (DE)

(73) Assignee: Infineon Technologies AG, Munich (DE)

( * ) Notice: Subject to any disclaimer, the term of this patent is extended or adjusted under 35 U.S.C. 154(b) by 109 days.

(21) Appl. No.: 11/138,671

(22) Filed: May 27, 2005

(65) Prior Publication Data

US 2006/0267681 A1 Nov. 30, 2006

(30) Foreign Application Priority Data

May 27, 2004 (DE) ...................... 10 2004 025 917

(51) Int. Cl.
*H03F 1/00* (2006.01)
(52) U.S. Cl. ........................................ 330/1 A; 330/98
(58) Field of Classification Search ................ 330/1 A, 330/98, 310, 150, 295, 307
See application file for complete search history.

(56) References Cited

U.S. PATENT DOCUMENTS 3,377,548 A * 4/1968 Newbold ..................... 323/303
3,530,389 A * 9/1970 Hogan et al. .................. 330/9
6,784,718 B2   8/2004 Okamoto et al.
6,993,302 B2 * 1/2006 Bausov et al. ........... 455/127.1
2003/0043641 A1   3/2003 Mazumder et al.

* cited by examiner

*Primary Examiner*—Henry Choe
(74) *Attorney, Agent, or Firm*—Edell, Shapiro & Finnan, LLC

(57) ABSTRACT

An integrated circuit includes a first and a second amplifier circuit each driven by an input signal. The first and second amplifier circuits generate a first and a second control signal on the output side. The control signals are generated independently of one another and drive a first and second controllable resistor of a third amplifier circuit for generating a third control signal. The third control signal is fed back to the first and second amplifier circuits. Depending on the resistance value of the first and second controllable resistors of the third amplifier circuit, an output signal amplified with respect to the input signal is generated at an output terminal of the integrated circuit. The integrated circuit is an input amplifier of an integrated semiconductor memory and permits the input signal to be amplified with a gain independent of a level of the DC component of the input signal.

23 Claims, 7 Drawing Sheets

INTEGRATED CIRCUIT

CROSS REFERENCE TO RELATED APPLICATIONS

This application claims priority under 35 U.S.C. §119 to German Application No. DE 10 2004 025 917.8, filed on May 27, 2004, and titled "Integrated Circuit," the entire contents of which are hereby incorporated by reference.

FIELD OF THE INVENTION

The invention relates to an integrated circuit for amplifying an input signal, which can be used as an input amplifier of an integrated semiconductor memory.

BACKGROUND

In many computer-aided applications, it is necessary to exchange data between two integrated chips situated on the motherboard of a computer. Thus, for example, data have to be transferred bidirectionally between the processor and an integrated semiconductor memory, for example, a dynamic random access memory (DRAM) semiconductor memory. In order to store data signals that are transferred from the processor to the DRAM memory via a databus in memory cells of the integrated semiconductor memory, the incoming data signals have to be amplified by the integrated semiconductor memory prior to further processing.

For this purpose, the integrated semiconductor memory generally has an input amplifier. The input amplifier amplifies incoming data signals to a defined level. The bit lines connected to the memory cells are driven with this amplified level. In the case of an integrated semiconductor memory, a low voltage level of an incoming data signal, for example, a level of 1 V, is attenuated to an output level of 0 V, for example. A high voltage level of a data signal, for example, a voltage level of 1.45 V, is amplified to a high output level of 2.5 V. The bit lines connected to the memory cells in which the data signals are intended to be stored are driven with the low or high voltage level, respectively, by the input amplifier. In the case of an integrated semiconductor memory, a differential amplifier circuit is generally used as input amplifier.

FIG. 5 shows a known circuit of a differential amplifier in CMOS technology, such as is generally used as an input amplifier for an integrated semiconductor memory. Connected between a terminal VA for applying a supply potential VDD and a terminal VB for applying a reference potential VSS are a current mirror circuit 1 as active load, which includes two transistors T1, T2, a transistor T3 for applying an input signal Vin', a transistor T4 for applying a reference signal Vref', and a current mirror circuit 2 for generating the source summation current ISS. The current mirror circuit 2 is connected via a resistor R to the terminal VA for applying the supply potential VDD and includes two transistors T5, T6. For generating an output signal Vout', the input terminal E1', which represents the control terminal of the transistor T3, is driven with the input signal Vin'. A second input terminal E2', which forms the control terminal of the transistor T4, is driven with the reference signal Vref'. With correct dimensioning of the transistors T1, . . . , T6, the differential amplifier circuit generates the output signal Vout' with a high level, if the level of the input signal Vin' lies above the level of the reference signal Vref'. Conversely, the differential amplifier circuit generates the output signal Vout' with a low level, if the input signal Vin' lies below the level of the reference signal Vref'.

Data transfer rates, particularly in CMOS technology, have continually increased in recent years. In order to meet the high speed requirements, the source summation current ISS, which is fed into the two parallel branches of the differential amplifier by the current mirror circuit 2 acts as a current source, to be increased further and further. The present high speed requirements thus cause an extreme rise in the current consumption of the differential amplifier in CMOS technology used as an input amplifier. A low current consumption is generally of interest, however.

A further difficulty in the use of a conventional differential amplifier as an input amplifier of an integrated semiconductor memory arises because the supply voltages available on the motherboard of a computer are decreasing further and further. Consequently, it is becoming more and more difficult to operate the transistors T1 . . . , T6 connected between the supply potential and the reference potential. In addition to the drain-source voltage drops at these transistors, the threshold voltages of the transistors also pose a problem, in particular, since the threshold voltages cannot be scaled with the decreasing supply voltages. The consequence is that three transistors in series, such as the transistors T1, T2 of the active load 1, the input transistors T3, T4, respectively, and the transistors of the current mirror circuit 2, can no longer be driven, or can be driven only with very great difficulty, between the high supply potential VDD and the reference potential VSS.

As described above, the differential amplifier compares a high or low level of the input signal Vin' with the level of the reference signal Vref'. In this case, the operating point of the differential amplifier circuit is set such that, at a level of the reference signal Vref' that lies precisely in the middle between a possible high or low level of the input signal Vin', the differential amplifier circuit generates, on the output side, the output signal Vout' with an amplified high or low output level matched to the downstream circuit stages. The small supply voltages or the tolerances of resistors of a voltage divider from which the potential of the reference voltage is generally generated have the effect, however, that the level of the reference signal Vref' cannot be set precisely to the middle level between the high voltage potential and the low voltage potential of the input signal Vin'. Due to this inaccuracy with which the reference level can be set, the differential amplifier circuit very easily drifts from its operating point.

A further problem occurs because not every input signal Vin' is coupled to a dedicated reference signal Vref' when a differential amplifier is used as an input amplifier of an integrated semiconductor memory in CMOS technology. As a result, a noise signal superposed on the input signal is not simultaneously superposed on the reference signal. Consequently, high common-mode rejection, as in the case of ECL logic, for instance, is not afforded in the case of a differential amplifier in CMOS technology.

Furthermore, fluctuations of the reference voltage Vref' entail large deviations in the duty cycle. The duty cycle specifies how an input signal is temporally mapped into an output signal at the output terminal of the differential amplifier. The imprecise setting of the reference voltage ultimately has the effect that the temporal length of an input signal pulse does not correlate with the length of an output signal pulse. Signal distortions at the output terminal of the differential amplifier are the consequence.

The disadvantages described above have the effect that a conventional differential amplifier circuit becomes less and less usable as an input amplifier of an integrated semiconductor memory.

An integrated circuit for amplifying an input signal is independent of fluctuations of the supply voltage and independent of a level of a DC component of the input signal is desirable. Further, a method by which an input signal can be amplified independently of fluctuations of the supply voltage and independently of a level of a DC component of the input signal is also desirable.

SUMMARY

An integrated circuit according to the present invention includes an input terminal for applying an input signal with a high and a low level. The input signal has a DC component. The integrated circuit includes a first amplifier circuit for generating a first control signal with a first input terminal, which is connected to the input terminal for applying the input signal, a second amplifier circuit for generating a second control signal with a second input terminal, which is connected to the input terminal for applying the input signal, and a third amplifier circuit, having a first controllable resistor with a control terminal and a second controllable resistor with a control terminal. The control terminal of the first controllable resistor of the third amplifier circuit is driven with the first control signal and the control terminal of the second controllable resistor of the third amplifier circuit is driven with the second control signal. The first and second amplifier circuits are designed such that the first amplifier circuit driven by the high level of the input signal generates the first control signal with a first level, so that the first controllable resistor of the third amplifier circuit is controlled in high-resistance fashion, and the second amplifier circuit driven by the high level of the input signal generates the second control signal with a first level, so that the second controllable resistor of the third amplifier circuit is controlled in low-resistance fashion. The first level of the first control signal and the first level of the second control signal are independent of the level of the DC component of the input signal. Furthermore, the first and second amplifier circuits are designed such that the first amplifier circuit driven by the low level of the input signal generates the first control signal with a second level, so that the first controllable resistor of the third amplifier circuit is controlled in low-resistance fashion, and the second amplifier circuit driven by the low level of the input signal generates the second control signal with a second level, so that the second controllable resistor of the third amplifier circuit is controlled in high-resistance fashion. The second level of the first control signal and the second level of the second control signal are independent of the level of the DC component of the input signal.

In contrast to a differential amplifier circuit, in which the level of an input signal is compared with the level of a reference signal, the circuit concept according to the present invention no longer requires a reference signal. The operating behavior of such an input amplifier is independent of a predefined reference signal level. A differential amplifier circuit is usually dimensioned to behave stably at a chosen operating point, if the level of the reference signal lies precisely in the middle between a high and a low level of the input signal. The differential amplifier circuit is thus very sensitive toward fluctuations of the reference signal, whereas the integrated circuit according to the present invention is relatively robust by being independent of a reference signal.

In one development of the integrated circuit, the first and second amplifier circuits each have a feedback terminal. The third amplifier circuit furthermore has an output terminal for generating a third control signal. The output terminal of the third amplifier circuit is connected to the feedback terminal of the first amplifier circuit via a first feedback resistor and to the feedback terminal of the second amplifier circuit via a second feedback resistor. After a single driving by the second level of the first control signal or the second level of the second control signal, the third amplifier drives the first and second amplifier circuits with a first level of the third control signal via the respective feedback terminal. The third amplifier circuit further drives the first and second amplifier circuits with a second level of the third control signal via the respective feedback terminal, after a single driving by the first level of the first control signal or the first level of the second control signal. Finally, the first amplifier circuit driven by the feedback terminal of the first amplifier circuit with the first level of the third control signal generates the first control signal with the second level so that the first controllable resistor of the third amplifier circuit is controlled in low-resistance fashion, and the second amplifier circuit driven by the feedback terminal of the second amplifier circuit with the first level of the third control signal generates the second control signal with the second level, so that the second controllable resistor of the third amplifier circuit is controlled in high-resistance fashion. Furthermore, the first amplifier circuit driven by the feedback terminal of the first amplifier circuit with the second level of the third control signal generates the first control signal with the first level, so that the first controllable resistor of the third amplifier circuit is controlled in high-resistance fashion, and the second amplifier circuit driven by the feedback terminal of the second amplifier circuit with the second level of the third control signal generates the second control signal with the first level, so that the second controllable resistor of the third amplifier circuit is controlled in low-resistance fashion.

By providing the feedback of the third control signal to the feedback terminal of the first and second amplifier circuits, after a single driving of the first and second amplifier circuits with the input signal, either the first controllable resistor of the third amplifier circuit is controlled in low-resistance fashion and the second controllable resistor of the third amplifier circuit is controlled in high-resistance fashion or conversely, the first controllable resistor of the third amplifier circuit is controlled in high-resistance fashion and the second controllable resistor of the third amplifier circuit is controlled in low-resistance fashion. This prevents the third amplifier circuit from assuming an undefined state in the absence of an input signal, i.e., from generating the third control signal with neither the first nor the second level.

In a further refinement, the integrated circuit includes a terminal for applying a supply potential and a terminal for applying a reference potential. The first and second amplifier circuits are each connected between the terminal for applying the supply potential and the terminal for applying the reference potential.

In one development of the integrated circuit, the first amplifier circuit includes a first transistor with a gate terminal, a source terminal, and a drain terminal for generating the first control signal. The drain terminal of the first transistor of the first amplifier circuit is connected via a first resistor of the first amplifier circuit to the terminal for applying the supply potential and simultaneously to the control terminal of the first controllable resistor of the third amplifier circuit. The source terminal of the first transistor of the first amplifier circuit is connected to the terminal for applying the reference potential. The first amplifier circuit generates a level-shifted input signal from the input signal. The level-shifted input signal has a different level of a DC component than the level of the DC component of the input signal. The different level of the DC component of the level-shifted input signal is independent of the level of the DC component of the input signal. The level-shifted input signal of the first amplifier circuit is fed to the gate terminal of the first transistor of the first amplifier circuit.

In another embodiment of the integrated circuit, the first transistor of the first amplifier circuit has a threshold voltage. In the first amplifier circuit, the level of the DC component of the level-shifted input signal of the first amplifier circuit approximately corresponds to a level of the threshold voltage of the first transistor of the first amplifier circuit.

According to a further feature of the integrated circuit, the first amplifier circuit includes a differentiating element with a capacitor. The capacitor is connected between the input terminal of the first amplifier circuit and the control terminal of the first transistor of the first amplifier circuit.

The DC component of the input signal is split off by the differentiating element. The level-shifted input signal presented downstream of the differentiating element is thus independent of the level of the DC component of the driving input signal.

In this case, the capacitor of the first amplifier circuit is, for example, a second transistor, in which a drain terminal and a source terminal are connected to one another and are connected to the gate terminal of the first transistor of the first amplifier circuit.

In accordance with a variation of the integrated circuit according to the present invention, the first amplifier circuit includes a second resistor and a third resistor for setting an operating point of the first amplifier circuit. The second resistor of the first amplifier circuit is connected between the terminal for applying the supply potential and the gate terminal of the first transistor of the first amplifier circuit. The third resistor of the first amplifier circuit is connected between the terminal for applying the reference potential and the gate terminal of the first transistor of the first amplifier circuit.

According to one development of the integrated circuit, the feedback terminal of the first amplifier circuit is connected to the control terminal of the first transistor of the first amplifier circuit.

According to a further embodiment of the integrated circuit, the first transistor of the first amplifier circuit is, for example, an n-channel field-effect transistor.

In another possible implementation of the integrated circuit of the present invention, the second amplifier circuit includes a first transistor with a gate terminal, a source terminal, and a drain terminal for generating the second control signal. The drain terminal of the first transistor of the second amplifier circuit is connected via a first resistor to the terminal for applying the reference potential and simultaneously to the control terminal of the second controllable resistor of the third amplifier circuit. The source terminal of the first transistor of the second amplifier circuit is connected to the terminal for applying the supply potential. The second amplifier circuit generates a level-shifted input signal from the input signal. The level-shifted input signal has a different level of a DC component than the level of the DC component of the input signal. The different level of the DC component of the level-shifted input signal is independent of the level of the DC component of the input signal. The level-shifted input signal of the second amplifier circuit is fed to the gate terminal of the first transistor of the second amplifier circuit.

In accordance with a further feature of the integrated circuit according to the invention, the first transistor of the second amplifier circuit has a threshold voltage. In the second amplifier circuit, the level of the DC component of the level-shifted input signal of the second amplifier circuit approximately corresponds to a level of the threshold voltage of the first transistor of the second amplifier circuit.

In one development of the integrated circuit, the first amplifier circuit includes a differentiating element with a capacitor. The capacitor is connected between the input terminal of the second amplifier circuit and the control terminal of the first transistor of the second amplifier circuit.

The capacitor of the second amplifier circuit is, for example, a second transistor in which a drain terminal and a source terminal are connected to one another and are connected to the gate terminal of the first transistor of the second amplifier circuit.

In another embodiment of the integrated circuit according to the present invention, the second amplifier circuit includes a second resistor and a third resistor for setting an operating point of the second amplifier circuit. The second resistor of the second amplifier circuit is connected between the terminal for applying the supply potential and the gate terminal of the first transistor of the second amplifier circuit. The third resistor of the second amplifier circuit is connected between the terminal for applying the reference potential and the gate terminal of the first transistor of the second amplifier circuit.

The first and second amplifier circuits are each common-source connections and therefore have a high voltage gain. In contrast to a differential amplifier circuit, obtaining the high gain and a fast switching behavior does not necessitate increasing the shunt current between the terminal for applying the supply potential and the terminal for applying the reference potential.

The operating point downstream of the capacitor, which acts as a decoupling capacitor for separating the DC component of the input signal, is determined essentially by the first and second resistors of the first and second amplifier circuits. By using a resistor divider as compared to active elements, such as, for example, transistors connected as a capacitor for setting the operating point, results in a low capacitance per unit length of the resistor elements. Therefore, using resistors for setting the operating point, during a change in the input signal from the high to the low signal level, relatively small parasitic capacitances of the resistors are subject to charge reversal. Consequently, the integrated circuit according to the invention also enables operation with high-frequency input signals.

The differentiating element connected between the respective input terminal of the first and second amplifier circuits and the gate terminal of the respective first transistor of the first and second amplifier circuits splits off the DC component from the input signal and transmits an AC component of the input signal to the respective gate terminal of the first transistor of the first and second amplifier circuits. The AC component is raised to a different level of a DC component by the resistor divider. For this purpose, the resistor divider is dimensioned such that the level-shifted input signal, downstream of the differentiating element, has the level of a DC component, which corresponds to the threshold voltage of the first transistor of the first and second amplifier circuits. The high and low levels of the level-shifted input signal thus oscillate about the threshold voltage of the respective first transistor of the first and second amplifier circuits. By individual adaptation of the level-shifted input signal to the threshold voltage of the transistor connected downstream, the first and second amplifier circuits operate independently of the level of the DC component of the input signal. Fluctuations of the level of the reference signal that generally accompany fluctuations of the DC component of the input signal thus have relatively no effect on the switching behavior of the respective first transistor of the first and second amplifier circuits.

According to a further possible circuit design, the feedback terminal of the second amplifier circuit is connected to the control terminal of the first transistor of the second amplifier circuit.

Depending on the dimensioning of the differentiating element formed from the capacitor and the second resistor of the first and second amplifier circuits, a rising edge of the input signal downstream of the differentiating element is converted into a positive voltage pulse and a falling signal edge downstream of the differentiating element is converted into a negative signal pulse. In the case of short time constants of the differentiating element, for example, a low value of the third resistor of the first and second amplifier circuits, the charge stored momentarily on the capacitor as a result of the positive or negative voltage pulse is discharged relatively rapidly via the third resistor of the first and second amplifier circuits to the terminal for applying the reference potential. The voltage pulse at the gate terminal therefore decays after a relatively short time. The first transistor of the first and second amplifier circuits is thus in an undefined switching state, so that the first and second control signals also drive the first and second controllable resistors of the third amplifier circuit with an undefined level. As a result, the third amplifier circuit is also in an undefined state so that the integrated circuit generates the output signal with an undefined level on the output side. In the worst-case scenario, both controllable resistors of the third amplifier circuit are controlled in low-resistance fashion, which results in a high shunt current through the third amplifier circuit.

The feedback of the third control signal to the gate terminal of the first transistor of the first and second amplifier circuits, which is positive feedback, counteracts the degeneration of the positive or negative voltage pulse by relatively slightly raising or lowering the voltage potential at the gate terminal of the first transistor of the first and second amplifier circuits. Consequently, the integrated circuit remains in a stable state, even in the case of low-frequency input signals or in the absence of driving by the input signal.

The first transistor of the second amplifier circuit is, for example, a p-channel field-effect transistor.

In a further embodiment of the integrated circuit according to the invention, the first controllable resistor of the third amplifier circuit is connected between the terminal for applying the reference potential and the output terminal of the third amplifier circuit. The second controllable resistor of the third amplifier circuit is connected between the terminal for applying the supply potential and the output terminal of the third amplifier circuit.

In this refinement of the third amplifier circuit, the feedback prevents both the first and the second controllable resistor of the third amplifier circuit from both being controlled in low-resistance fashion in the absence of an input signal and in the case of low-frequency input signals and, consequently, a high shunt current from flowing away via the third amplifier circuit from the terminal for applying the supply potential to the terminal for applying the reference potential.

According to a further variaion, the integrated circuit according to the invention includes an output terminal and a first and second inverter circuit. The first and second inverter circuits are each connected between the terminal for applying the supply potential and the terminal for applying the reference potential. Furthermore, the output terminal of the third amplifier circuit is connected to the output terminal of the integrated circuit via the first and second inverter circuits.

In one possible implementation of the integrated circuit, the first level of the first, second and third control signals is a low voltage level, whereas the second level of the first, second and third control signals is a high voltage level.

In a further refinement of the integrated circuit, the first controllable resistor of the third amplifier circuit is an n-channel field-effect transistor. The second controllable resistor of the third amplifier circuit is a p-channel field-effect transistor.

A method for amplifying an input signal provides for the use of an input signal with a high and a low level, the input signal having a DC component. In this case, the method is applied to an integrated circuit with a supply potential and a reference potential with a first amplifier circuit and a second amplifier circuit with a first controllable resistor and a second controllable resistor. An input terminal of the first amplifier circuit and an input terminal of the second amplifier circuit are driven with the high and the low level of the input signal. A level-shifted input signal with a level of a DC component is thereupon generated in the first amplifier circuit. The level of the DC component of the level-shifted input signal of the first amplifier circuit approximately corresponds to a level of a threshold voltage of a first transistor of the first amplifier circuit. A level-shifted input signal with a level of a DC component is generated in the second amplifier circuit. The level of the DC component of the level-shifted input signal of the second amplifier circuit approximately corresponds to a level of a threshold voltage of a first transistor of the second amplifier circuit. The first amplifier circuit consequently generates a first control signal with a first level and the second amplifier circuit generates a second control signal with a first level if the input signal has the high level. The first amplifier circuit generates the first control signal with a second level and the second amplifier circuit generates the second control signal with a second level, if the input signal has the low level. The first controllable resistor is controlled into a low-resistance state when the first controllable resistor is driven by the second level of the first control signal. The second controllable resistor is controlled into a high-resistance state when the second controllable resistor is driven by the second level of the second control signal. This is followed by generation of a third control signal with a first level. The first controllable resistor is controlled into a high-resistance state when the first controllable resistor is driven by the first level of the first control signal. The second controllable resistor is controlled into a low-resistance state when the second controllable resistor is driven by the first level of the second control signal. This is followed by generation of the third control signal with a second level. An output signal is generated with the level of the reference potential, if the third control signal has the first level. The output signal is generated with the level of the supply potential, if the third control signal has the second level.

In one development of the method for amplifying an input signal, the third control signal is fed back to a control terminal of the first transistor of the first amplifier circuit and the third control signal is fed back to a control terminal of the first transistor of the second amplifier circuit.

BRIEF DESCRIPTION OF THE DRAWINGS

The invention is explained in more detail below with reference to the figures showing exemplary embodiments of the invention, in which.

DETAILED DESCRIPTION

Figure 1:
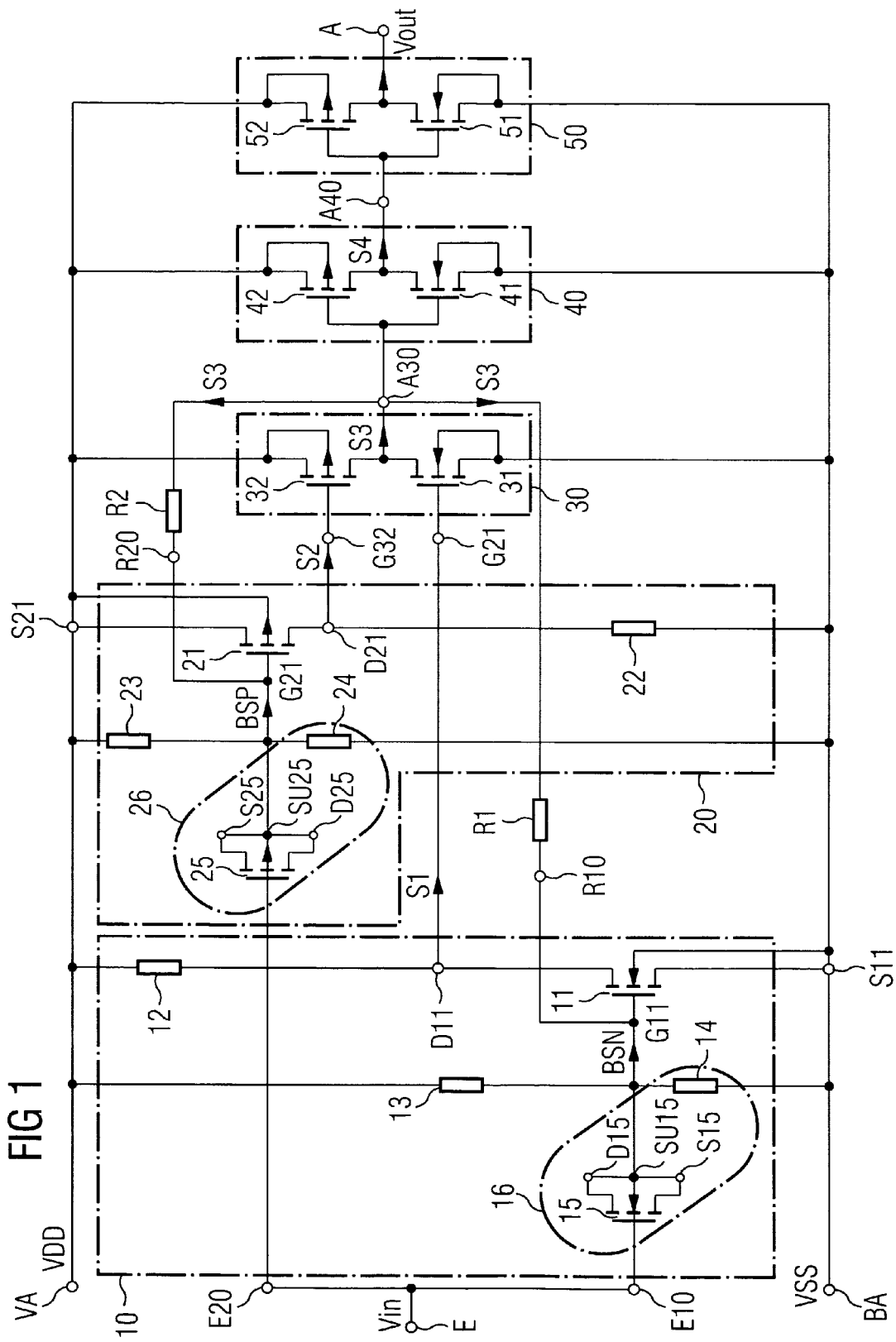
FIG. 1 shows an embodiment of an integrated circuit for amplifying an input signal according to the invention.

FIG. 1 shows an embodiment of an integrated circuit for amplifying an input signal according to the invention. The input signal Vin has a DC component and an AC component. The integrated circuit includes an input terminal E for applying an input signal Vin, a terminal VA for applying a supply potential VDD, and a terminal BA for applying a reference potential VSS. A first amplifier circuit 10 and a second amplifier circuit 20 are connected between the terminal VA for applying the supply potential VDD and the terminal BA for applying the reference potential VSS.

The first amplifier circuit 10 is a common-source connection with a high voltage gain. The first amplifier circuit 10 has an input terminal E10 connected to the input terminal E for applying the input signal Vin, and includes a first transistor 11 with a gate terminal G11 with a source terminal S11 and a drain terminal D11 for generating a first control signal S1. The drain terminal D11 of the first transistor 11 of the first amplifier circuit 10 is connected via a first resistor 12 of the first amplifier circuit 10 to the terminal VA for applying the supply potential VDD. The source terminal S11 of the first transistor of the first amplifier circuit 10 is connected to the terminal BA for applying the reference potential VSS. The operating point of the first amplifier circuit 10 is set by corresponding dimensioning of a second resistor 13 and a third resistor 14 of the first amplifier circuit 10. In order to separate the AC component from the DC component of the input signal Vin, a capacitor 15 is connected between the input terminal E10 of the first amplifier circuit and the control terminal G11 of the first transistor 11 of the first amplifier circuit 10. The capacitor 15 is an n-channel MOSFET transistor whose drain terminal D15 and source terminal S15 are short-circuited with a substrate terminal SU15. The n-channel MOSFET transistor 15 connected as a capacitor forms a differentiating element 16 with the third resistor 14 of the first amplifier circuit 10. The first amplifier circuit 10 generates the first control signal S1 at the drain terminal D11 of the first transistor 11, which simultaneously forms the output terminal of the first amplifier circuit 10.

The operating point of the first amplifier circuit 10 is essentially set by corresponding dimensioning of the second and third resistors 13, 14 of the second amplifier circuit. The resistor divider serves, in particular, for shifting the AC component of the input signal Vin, which has been separated from its DC component by the differentiating element 16, to a different level of a DC component. Consequently, a level-shifted input signal BSN arises at the gate terminal G11 of the first transistor 11 of the first amplifier circuit 10. The resistor divider includes the second and third resistors in this case dimensioned such that the level of the DC component of the level-shifted input signal BSN corresponds to the level of the threshold voltage of the first transistor 11 of the first amplifier circuit 10. As a result, the n-channel field-effect transistor 11 is controlled in the on state at a high level of the level-shifted input signal BSN and operated in turned-off fashion at a low level of the level-shifted input signal BSN. The control behavior of the first transistor 11 of the first amplifier circuit 10 is thus independent of the level of the DC component of the input signal Vin.

The second amplifier circuit 20 likewise forms an amplifier using common-source connection technology with a high voltage gain. The second amplifier circuit 20 has an input terminal E20 connected to the input terminal E for applying the input signal Vin, and includes a first transistor 21 with a gate terminal 21, a source terminal S21, and a drain terminal D21 for generating a second control signal S2. The drain terminal D21 of the first transistor 21 of the second amplifier circuit 20 is connected via a first resistor 22 to the terminal BA for applying the reference potential VSS. The source terminal S21 of the first transistor 21 of the second amplifier circuit 20 is connected to the terminal VA for applying the supply potential VDD. The operating point of the second amplifier circuit 20 is set by corresponding dimensioning of a second resistor 23 and a third resistor 24 of the second amplifier circuit 20, which are connected between the terminal VA for applying the supply voltage VDD and the terminal BA for applying the reference potential VSS. The DC component of the input signal Vin is separated from the AC component of the input signal Vin by a capacitor 25 connected between the input terminal E20 of the second amplifier circuit 20 and the control terminal G21 of the first transistor 21 of the second amplifier circuit 20. The capacitor 25 is a p-channel MOSFET transistor whose drain terminal D25 and source terminal S25 are short-circuited with a substrate terminal SU25. The p-channel MOSFET transistor 25 connected as a capacitor forms a differentiating element 26 with the third resistor 24 of the second amplifier circuit 20. The second amplifier circuit 20 generates the second control signal S2 at the drain terminal D21 of the first transistor 21 of the second amplifier circuit 20, which simultaneously forms the output terminal of the second amplifier circuit 20.

The operating point of the second amplifier circuit 20 is set by corresponding dimensioning of the second and third resistors 23, 24 of the second amplifier circuit. The resistor divider serves, in particular, for shifting the AC component of the input signal Vin, which has been separated from its DC component by the differentiating element 26, to a different level of a DC component. Consequently, a level-shifted input signal BSP arises at the gate terminal G21 of the first transistor 21 of the second amplifier circuit 20. The resistor divider includes the second and third resistors dimensioned such that the level of the DC component of the level-shifted input signal BSP corresponds to the level of the threshold voltage of the first transistor 21 of the second amplifier circuit 20. As a result, the p-channel field-effect transistor 21 is operated in turned-off fashion at a high level of the level-shifted input signal BSP and is controlled in the on state at a low level of the level-shifted input signal BSP. The control behavior of the first transistor 21 of the second amplifier circuit 20 is thus independent of a level of the DC component of the input signal Vin.

The integrated circuit according to the invention furthermore includes a third amplifier circuit 30 connected between the terminal VA for applying the supply potential VDD and the terminal BA for applying the reference potential VSS. The third amplifier circuit 30 has a first controllable resistor 31 connected between the terminal BA for applying the reference potential VSS and an output terminal A30 of the third amplifier circuit 30. The third amplifier circuit includes a second controllable resistor 32 connected between the terminal VA for applying the supply potential VDD and the output terminal A30 of the third amplifier circuit 30.

The first controllable resistor 31 of the third amplifier circuit 30 is an n-channel MOSFET transistor whose control terminal G31 is driven by the first control signal S1. Consequently, the resistance of the controllable resistor 31 or of the drain-source path of the n-channel field-effect transistor 31 is regulated by a level of the first control signal S1. The second controllable resistor 32 of the third amplifier circuit 30 is a p-channel MOSFET transistor whose control terminal G32 is driven by the second control signal S2. The resistance of the second controllable resistor 32 or the resistance of the drain-source path of the p-channel field-effect transistor 32 is thus controlled by a level of the second control signal S2.

The third amplifier circuit 30 generates a third control signal S3 at its output terminal A30. The third control signal S3 is fed to a feedback terminal R10 of the first amplifier circuit 10 via a feedback resistor R1. The feedback terminal R10 of the first amplifier circuit 10 is connected to the control terminal G11 of the first transistor 11 of the first amplifier circuit 10. Furthermore, the third control signal S3 is fed via a second feedback resistor R2 to a feedback terminal R20 of the second amplifier circuit 20, which is connected to the control terminal G21 of the first transistor 21 of the second amplifier circuit 20.

The output terminal A30 of the third amplifier circuit 30 is connected via a first inverter circuit 40 and a second inverter circuit 50 to an output terminal A of the integrated circuit for generating an output signal Vout. The two inverter circuits 40, 50, respectively, include an n-channel field-effect transistor 41, 51, which are each connected between the terminal BA for applying the reference potential VSS and the respective output terminal A40 of the first inverter circuit 40 and the output terminal A of the integrated circuit. Furthermore, the first and second inverter circuits 40, 50 each include a p-channel field-effect transistor 42, 52, which are each connected between the terminal VA for applying the supply potential VDD and the respective output terminal A40 of the first inverter circuit 40 and the output terminal A of the integrated circuit.

FIGS. 2A, 2B, 2C, 3, and 4 show the profile of the input signal Vin illustrated in FIG. 1 of the level-shifted input signal BSN of the first amplifier circuit 10, the level-shifted input signal BSP of the second amplifier circuit 20, the first control signal S1, the second control signal S2, the third control signal S3, the fourth control signal S4, and the profile of the output signal Vout.

The functioning of the integrated circuit according to the invention for amplifying the input signal Vin will be explained in more detail below with reference to the signal state diagram of FIG. 2A. Since the signal profiles are repeated from clock period to clock period, only the signal profiles within the first clock period between 4 ns and 8 ns are discussed below.

Figure 2A:
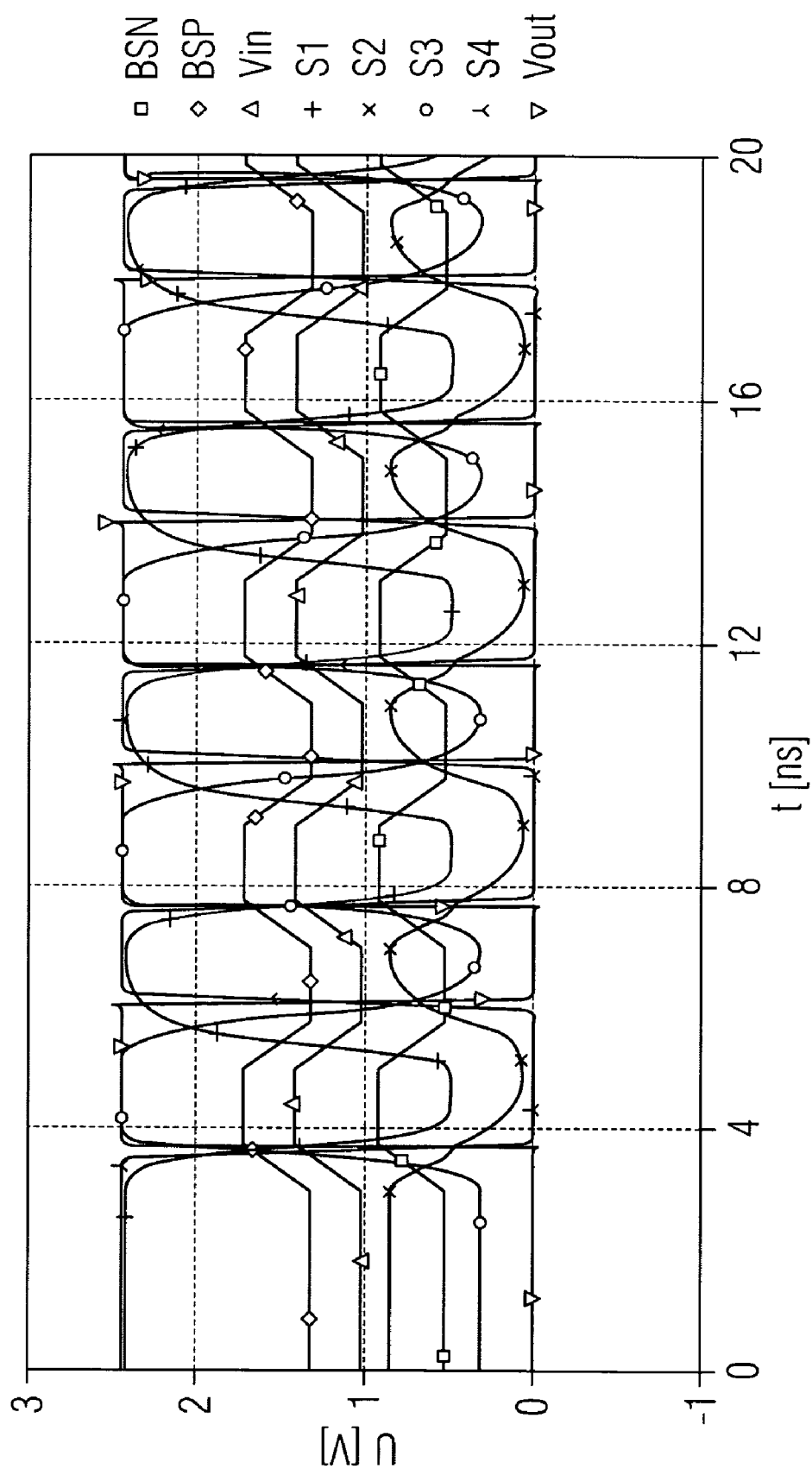
FIG. 2A shows a first signal state diagram of an integrated circuit for amplifying an input signal according to the invention.

As seen in the signal state diagram of FIG. 2A, the input signal Vin drives the input terminal E with a frequency of 250 MHz. When the input terminal E10 of the first amplifier circuit 10 is driven with the input signal Vin, the first amplifier circuit 10 generates the level-shifted input signal BSN. The DC component of the level-shifted input signal BSM has a lower level than the DC component of the input signal Vin. As described above, the DC component is separated from the AC component of the input signal Vin by the capacitor 15 of the differentiating element 16 and the resistor divider. The reisistor divider includes the second and third resistors of the first amplifier circuit 10 and generates the level-shifted input signal BSN with a shifted DC component that corresponds to the threshold voltage of the first transistor 11 of the first amplifier circuit 10. The level-shifted input signal BSN thus oscillates at approximately the level of the threshold voltage of the first transistor 11, so that a high level of the level-shifted input signal BSN causes the first transistor 11 of the first amplifier circuit 10 to be controlled in the on state and a low level of the level-shifted input signal BSN causes the first transistor 11 of the first amplifier circuit 10 to turn off.

Equally, the second amplifier circuit 20 generates the level-shifted input signal BSP from the input signal Vin fed to the second amplifier circuit 20 on the input side. The control terminal G21 of the second transistor 21 of the second amplifier circuit 20 is driven with the level-shifted input signal. The MOSFET transistor 25 acting as a capacitor forwards the AC component of the input signal Vin to the control terminal G21 of the second transistor 21 of the second amplifier circuit 20. The level of the DC component of the level-shifted input signal BSP is set by dimensioning the second and third resistors 23, 24 of the second amplifier circuit 20. In this case, the resistors 23, 24 are dimensioned such that the DC component of the level-shifted input signal BSP corresponds to a threshold voltage of the first transistor 21 of the second amplifier circuit 20. A high level of the level-shifted input signal BSP, which lies above the threshold voltage of the p-channel field-effect transistor 21, causes the first transistor 21 to turn off, whereas a low level, which lies below the threshold voltage of the p-channel field-effect transistor 21, causes the first transistor 21 of the second amplifier circuit 20 to be controlled in the on state.

Within the first clock period between 4 ns and 8 ns in the signal state diagram of FIG. 2A, the input signal Vin has a rising signal edge and reaches a high level of the input signal. Equally, the two level-shifted input signals BSN and BSP reach a high level that is level-shifted with respect thereto. The high level of the level-shifted input signal BSN of the first amplifier circuit 10 causes the n-channel MOSFET transistor 11 to be controlled in the on state. The drain terminal D11 is thus connected via the turned-on path of the first transistor 11 to the terminal BA for applying the reference potential VSS, so that the first control signal S1 is generated with a low level at the drain terminal D11 of the first transistor 11. In the second amplifier circuit 20, the high level of the level-shifted input signal BSP causes the p-channel MOSFET transistor 21 to turn off. The drain terminal D21 of the first transistor 21 is connected via the first resistor 22 to the terminal BA for applying the reference potential VSS, so that the second control signal S2 assumes a low signal level.

The first controllable resistor 31 of the third amplifier circuit 30 is controlled in high-resistance fashion by the low level of the first control signal S1, whereas the second controllable resistor 32 of the third amplifier circuit 30 is controlled in low-resistance fashion by the low level of the second control signal S2. The terminal VA for applying the supply potential VDD is thus connected to the output terminal A30 of the third amplifier circuit 30 in low-resistance fashion via the second controllable resistor 32. Consequently, the third control signal S3 arises at the output terminal A30 of the third amplifier circuit 30 with a level that relatively corresponds to the level of the supply voltage VDD.

This high level drives the control terminal G11 of the first transistor 11 of the first amplifier circuit 10 via the first feedback resistor R1. Since the level-shifted input signal BSN of the first amplifier circuit 10 likewise has a high signal level, the feedback of the third control signal S3 to the control terminal G11 of the first transistor 11 is positive feedback. This prevents a signal pulse that arises as a result of the differentiation of the input signal Vin by the differentiating element or the high-pass filter 16 from decaying too rapidly by charge flowing away via the resistor 14 to the reference terminal BA and the first transistor 11 thus attaining an undefined state since there is no longer a signal present at its gate terminal G11. In this case, the feedback resistor R1 is dimensioned with relatively high resistance in order that the subsequent level of an input signal Vin is not corrupted by the level of the third control signal S3.

Equally, the feedback of the third control signal S3 via the second feedback resistor R2 effects a positive feedback in the second amplifier circuit 20. The positive signal pulse of the input signal Vin that arises at the control terminal G21 of the first transistor 21 of the second amplifier circuit 20 by the differentiating element or the high-pass filter 26 is thus amplified by the high level of the third control signal S3 and does not degrade rapidly by charge flowing away via the third resistor 24. The first transistor 21 of the second amplifier circuit 20 thus remains turned off during the high level of the input signal Vin.

Further, the positive feedbacks of the control signal S3 to the control terminals G11, G21 of the first transistors of the first and second amplifier circuits 10, 20 effect a defined state at the respective control terminals G11, G21, even if no input signal Vin is present at the input terminal E. This ensures that the first and second control signals S1 and S2 are also generated with a level, so that at least one of the two controllable resistors 31 and 32 of the third amplifier circuit is operated in turned-off fashion to avoid a high shunt current that would flow from the terminal for applying the supply potential to the terminal for applying the reference potential in the event a first and second resistor of the third amplifier circuit is controlled in low-resistance fashion.

By the first inverter circuit 40, the high signal level of the third control signal S3 is converted into a low level corresponding to the level of the reference potential VSS at the output terminal A40 of the first inverter circuit. The low level at the output terminal A40 is transformed into a high signal level again by the second inverter circuit 50 at the output terminal A of the integrated circuit. In this case, the high signal level essentially corresponds to the supply voltage potential VDD.

The signal profile shown in the signal state diagram of FIG. 2A illustrates the case where the integrated circuit is driven with a low level of the input signal Vin. After driving the input terminal E10 of the first amplifier circuit 10, the low level of the input signal Vin is converted into a low level of the level-shifted input signal BSN. In this case, the low level of the level-shifted input signal BSN lies below the low level of the input signal Vin. The level shifting is effected by corresponding dimensioning of the resistors 13 and 14. The n-channel field-effect transistor 11 is operated in turned-off fashion by the low level of the level-shifted input signal BSN. As a result, the drain terminal D11 is connected to the supply potential VDD via the resistor 12. Consequently, the first control signal S1 arises with a high signal level at the drain terminal D11 of the first amplifier circuit 10. The high signal level of the first control signal S1 causes the controllable resistor 31 of the third amplifier circuit, which is, for example, an n-channel field-effect transistor, to be controlled in low-resistance fashion.

The low level of the input signal Vin is converted, in the second amplifier circuit 20, into a low level of the level-shifted input signal BSP lying above the low level of the input signal Vin. The low level of the level-shifted input signal BSP can be established by corresponding dimensioning of the resistors 23 and 24. As a result of the control terminal G21 of the first transistor 21 of the second amplifier circuit 20 being driven by the low level of the level-shifted input signal BSP, the p-channel field-effect transistor 21 is controlled in the on state. Since the terminal VA for applying the supply potential VDD is thus connected to the drain terminal D21 via the first transistor 21 controlled in the on state, the second control signal S2 thus has a high signal level.

As a result of the high signal level of the first control signal S1 and of the second control signal S2, the first controllable resistor 31 of the third amplifier circuit 30 is controlled in low-resistance fashion, whereas the second controllable resistor 32 of the third amplifier circuit 30 is controlled in high-resistance fashion. The third control signal S3 thus assumes a low signal level at the output terminal A30 of the third amplifier circuit 30.

The low signal level of the third control signal S3 is fed via the first feedback resistor R1 to the control terminal G11 of the first transistor 11 of the first amplifier circuit 10 and via the second feedback resistor R2 to the control terminal G21 of the first transistor 21 of the second amplifier circuit 20. Consequently, the positive feedback condition is met even in the case of a low level of the level-shifted input signals BSN and BSP.

The low level of the third control signal S3 is converted, by the first inverter circuit 40, into the fourth control signal S4 with a high signal level, which approximately corresponds to the level of the supply potential VDD, at the output terminal A40 of the first inverter circuit 40. The high level of the fourth control signal S4, which drives the second inverter circuit 50, is converted, by the second inverter circuit 50, into the low signal level approximately corresponding to the reference potential VSS at the output terminal A of the integrated circuit.

Consequently, at the output terminal A of the integrated circuit, when the input terminal E is driven with a high signal level of the input signal Vin, the output signal Vout arises with a high signal level approximately corresponding to the level of the supply potential VDD and, when the input terminal E is driven with a low signal level of the input signal Vin, the output signal Vout arises with a low signal level approximately corresponding to the level of the reference potential VSS. As shown in FIG. 2A, a fluctuation of the input signal level of +/−200 mV at the input terminal E is amplified into a fluctuation of the output signal level of approximately +/−2.5 V.

Figure 2B:
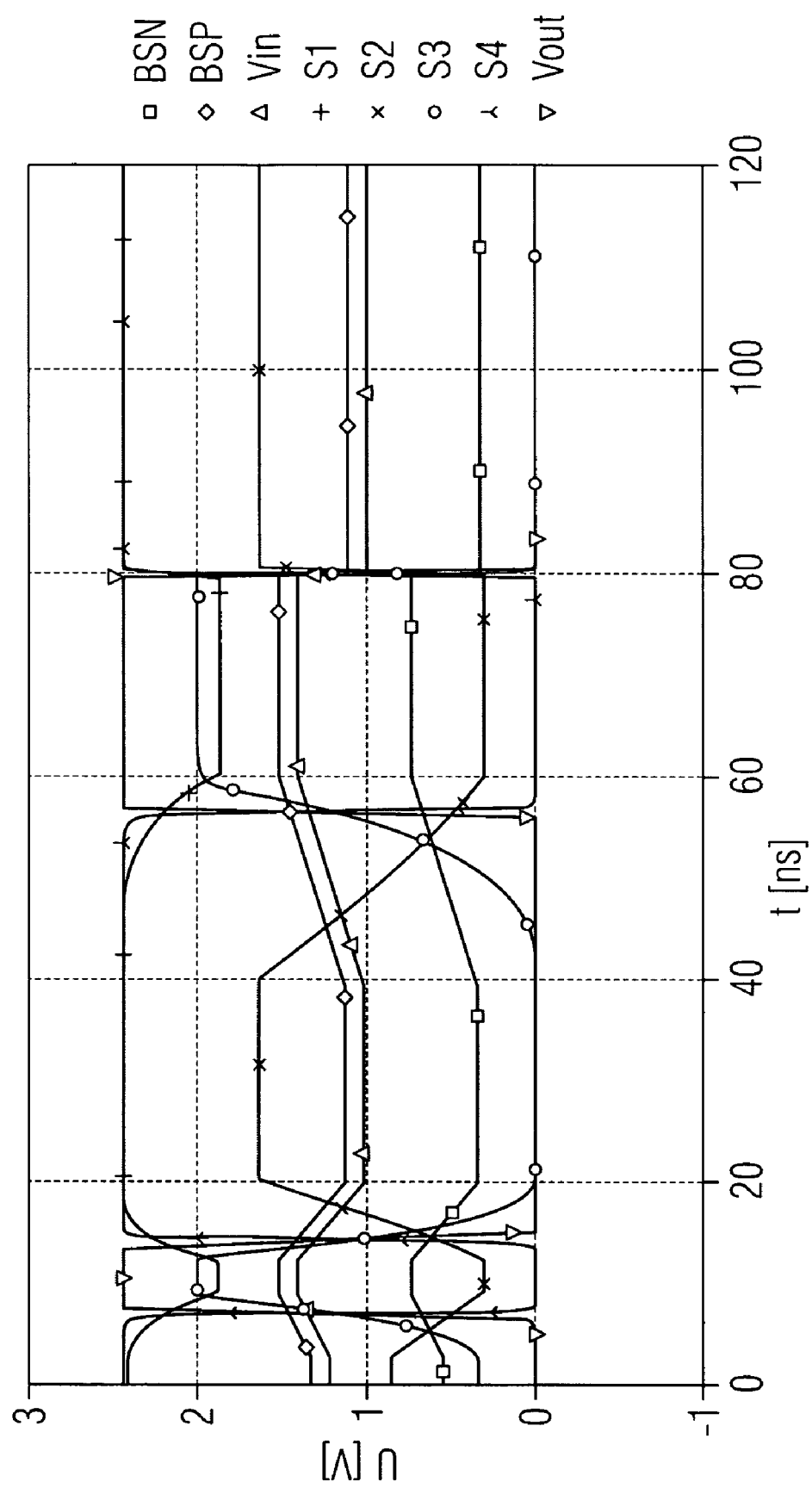
FIG. 2B shows a second signal state diagram of an integrated circuit for amplifying an input signal according to the invention.
Figure 2C:
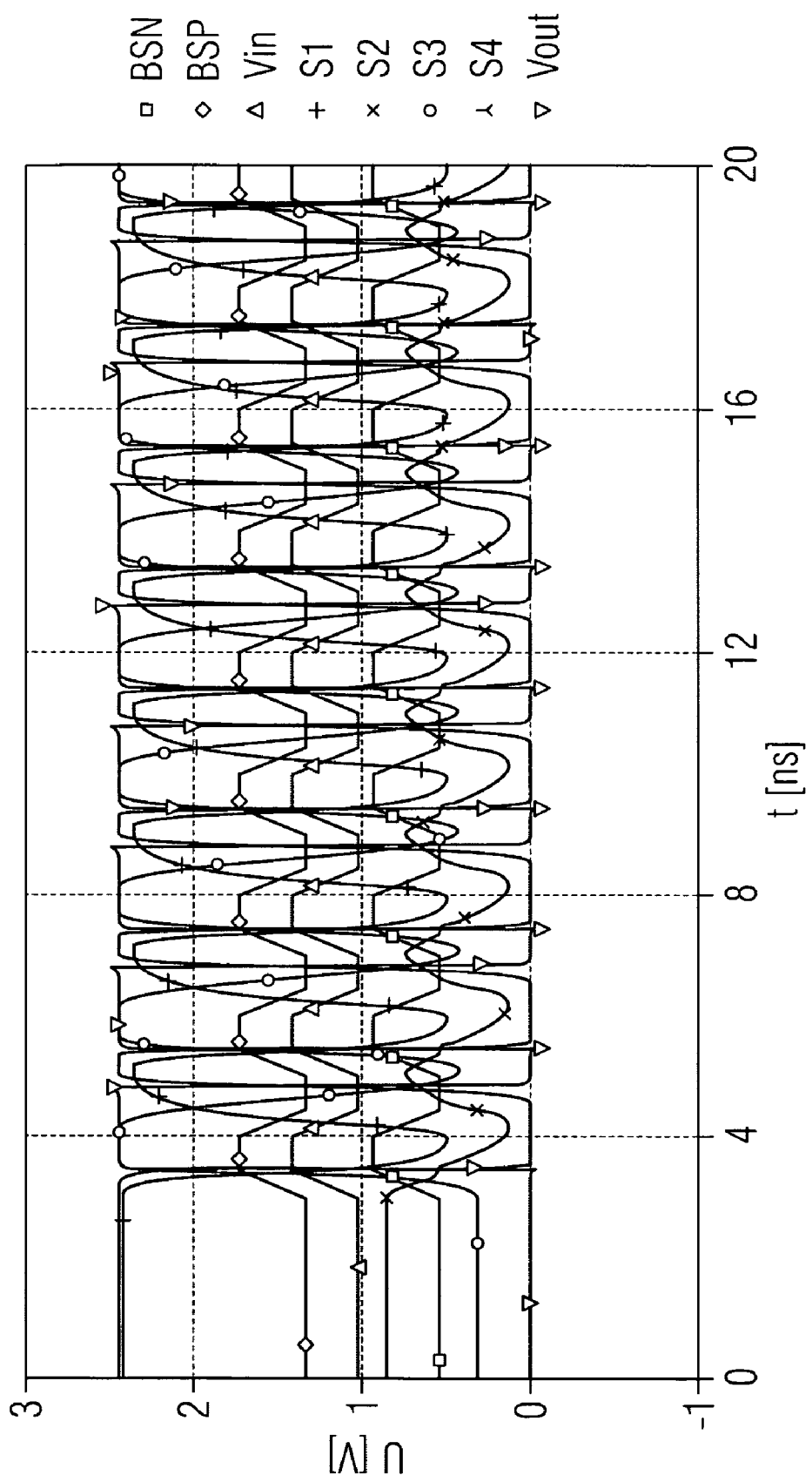
FIG. 2C shows a third signal state diagram of an integrated circuit for amplifying an input signal according to the invention.
Figure 3:
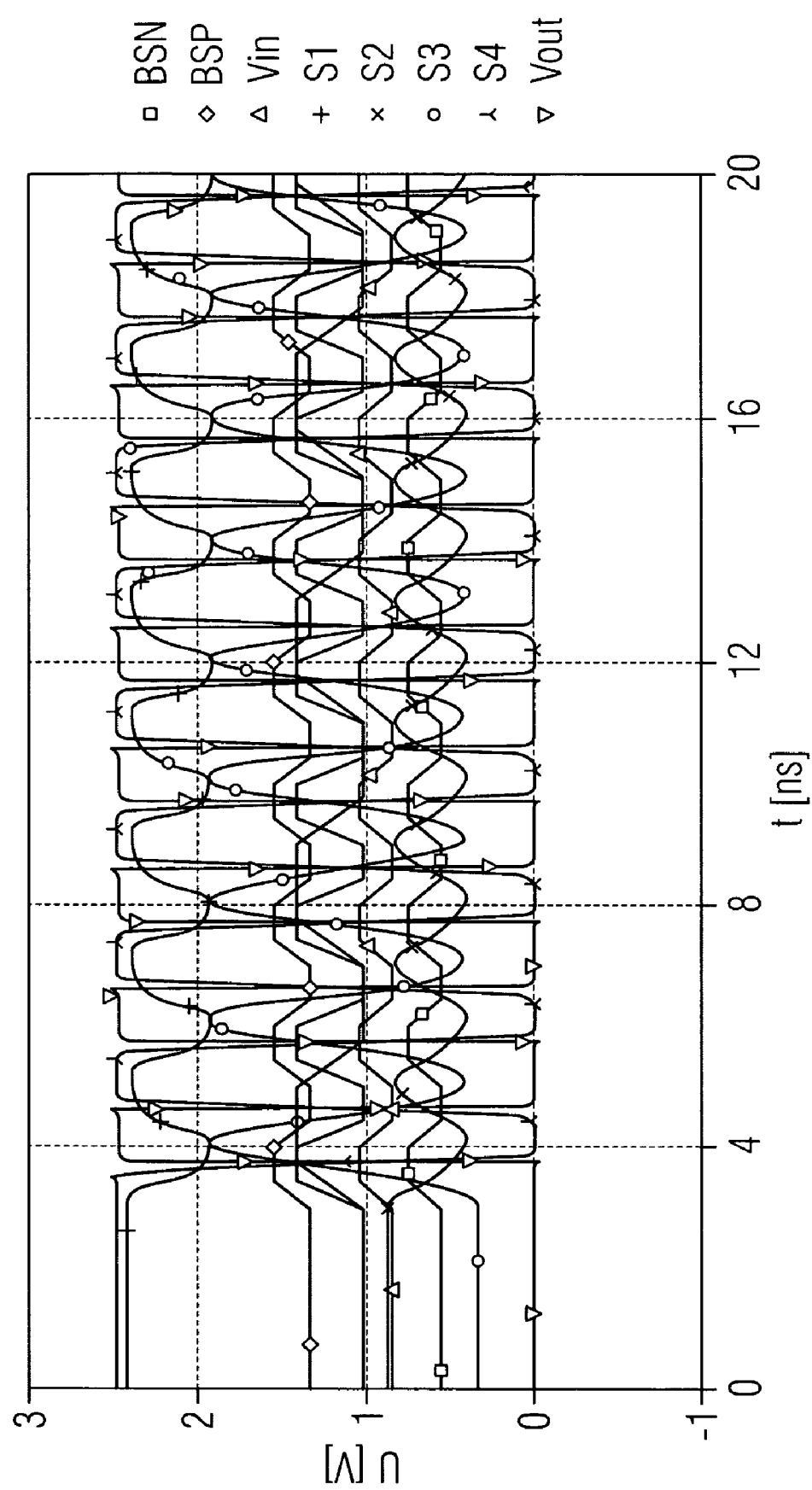
FIG. 3 shows a fourth signal state diagram of an integrated circuit for amplifying an input signal according to the invention.
Figure 4:
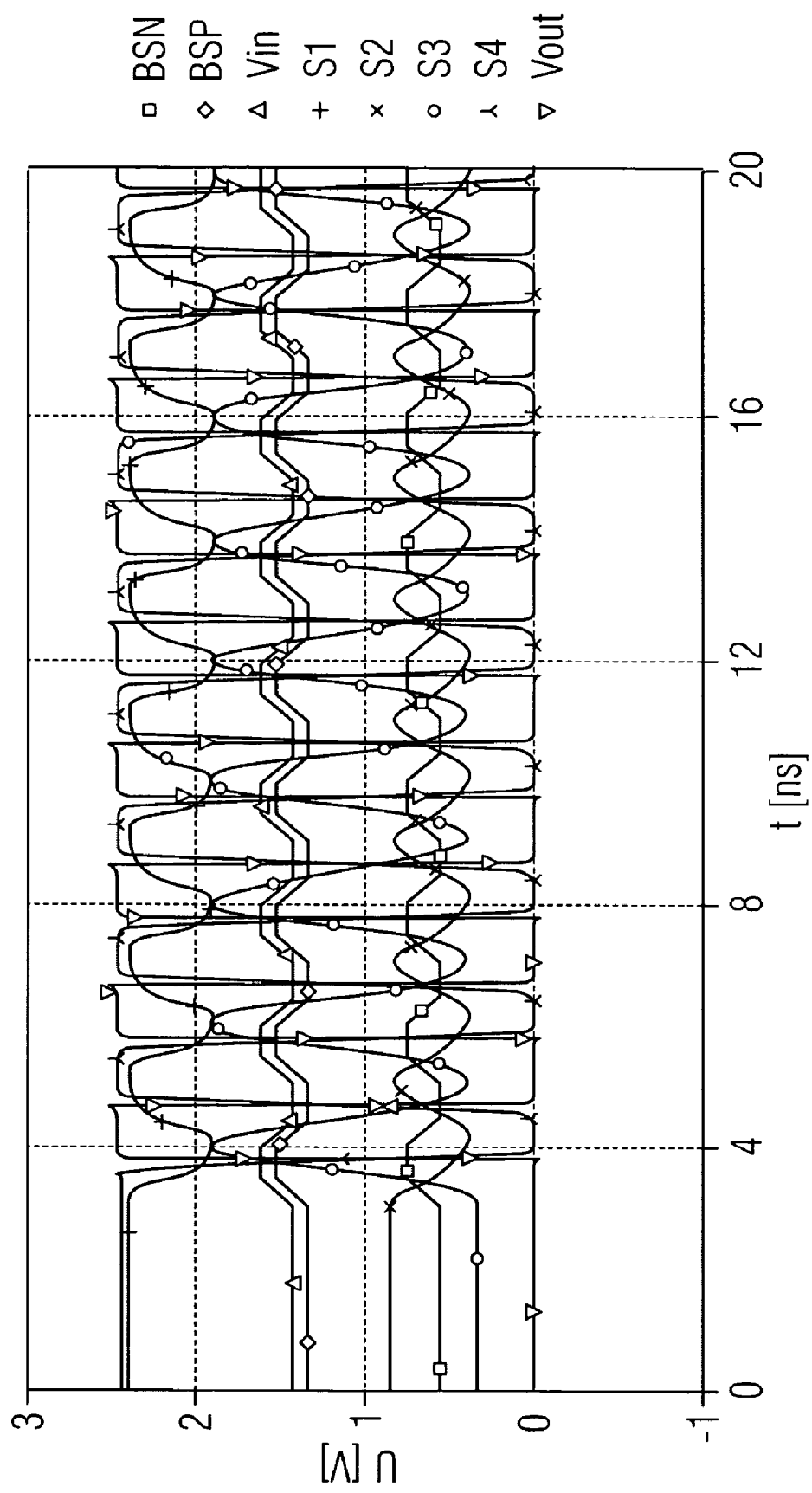
FIG. 4 shows a fifth signal state diagram of an integrated circuit for amplifying an input signal according to the invention.
Figure 5:
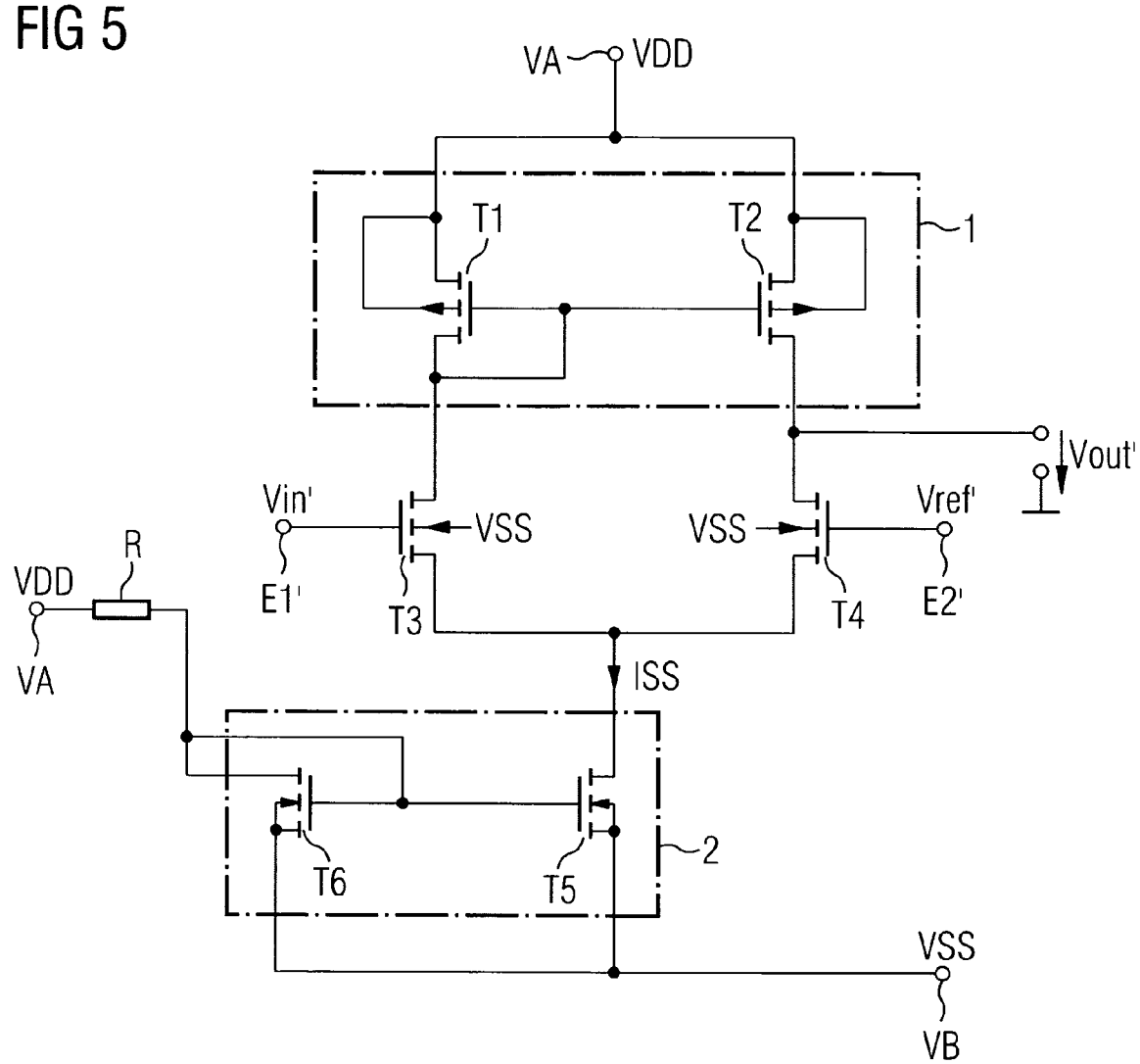
FIG. 5 shows an integrated circuit for amplifying an input signal in accordance with the prior art.

FIGS. 2B, 2C, 3, and 4 show further signal profiles of the integrated circuit according to the invention in the case of different driving with the input signal Vin. FIG. 2B shows the behavior of the integrated circuit according to the invention in the case of an input signal Vin having a low frequency and severely distorted edges. FIG. 2C shows the signal profile when the integrated circuit is driven with an input signal Vin at a high frequency of 500 MHz. FIG. 3 shows the signal profiles when the integrated circuit is driven with an input signal whose DC component is negatively shifted with respect to the input signal of FIG. 2A. FIG. 4 shows the signal profile when the integrated circuit is driven with an input signal whose DC component is positively shifted with respect to the input signal of FIG. 2A. FIGS. 2B, 2C, 3, and 4 show that the output signal Vout follows the input signal in the case of the illustrated instances of different driving by the input signal Vin.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS 1, 2 Current mirror circuit
10 First amplifier circuit
11 Transistor of the first amplifier circuit
12, 13, 14 Resistor of the first amplifier circuit
15 Capacitor
16 Differentiating element
20 Second amplifier circuit
21 Transistor of the second amplifier circuit
22, 23, 24 Resistor of the second amplifier circuit
25 Capacitor
26 Differentiating element
30 Third amplifier circuit
31, 32 Controllable resistor of the third amplifier circuit
40 First inverter circuit
41, 42 Switching transistors of the first inverter circuit
50 Second inverter circuit
51, 52 Switching transistors of the second inverter circuit
A Output terminal of the integrated circuit
D Drain terminal
E Input terminal
G Gate terminal
R1, R2 Feedback resistor
R10, R20 Feedback terminal
S Source terminal
S1, S2, S3, S4 Control signals
SU Substrate terminal
T Transistor
VA Terminal for applying the supply potential
VB Terminal for applying the reference potential
VDD Supply potential
Vin Input signal
Vout Output signal
VSS Reference potential

What is claimed:
1. An integrated circuit, comprising:
an input terminal for applying an input signal with a high and a low level, the input signal having a DC component;
a first amplifier circuit for generating a first control signal with a first input terminal connected to the input terminal for applying the input signal;
second amplifier circuit for generating a second control signal with a second input terminal connected to the input terminal for applying the input signal; and
a third amplifier circuit including a first controllable resistor with a control terminal and a second controllable resistor with a control terminal, the control terminal of the first controllable resistor of the third amplifier circuit driven with the first control signal, the control terminal of the second controllable resistor of the third amplifier circuit driven with the second control signal,
wherein the first amplifier circuit driven by the high level of the input signal generates the first control signal with a first level so that the first controllable resistor of the third amplifier circuit is controlled in high-resistance fashion, the second amplifier circuit driven by the high level of the input signal generates the second control signal with a first level so that the second controllable resistor of the third amplifier circuit is controlled in low-resistance fashion, the first level of the first control signal and the first level of the second control signal being independent of the level of the DC component of the input signal, and
wherein the first amplifier circuit driven the low level of the input signal generates the first control signal with a second level so that the first controllable resistor of the third amplifier circuit is controlled in low-resistance fashion, the second amplifier circuit driven by the low level of the input signal generates the second control signal with a second level so that the second controllable resistor of the third amplifier circuit is controlled in high-resistance fashion, the second level of the first control signal and the second level of the second control signal being independent of the level of the DC component of the input signal.
2. The integrated circuit as claimed in claim 1, wherein the first and second amplifier circuits each have a feedback terminal, the first amplifier circuit driven by the feedback terminal of the first amplifier circuit with the first level of the third control signal generates the first control signal with the second level so that the first controllable resistor of the third amplifier circuit is controlled in low-resistance fashion, the second amplifier circuit driven by the feedback terminal of the second amplifier circuit with the first level of the third control signal, generates the second control signal with the second level so that the second controllable resistor of the third amplifier circuit is controlled in high-resistance fashion,
the third amplifier circuit has an output terminal for generating a third control signal, after a single driving by the second level of the first control signal or the second level of the second control signal, the third amplifier circuit drives the first and second amplifier circuits with a first level of the third control signal via the respective feedback terminal, and after a single driving by the first level of the first control signal or the first level of the second control signal, the third amplifier circuit drives the first and second amplifier circuits with a second level of the third control signal via the respective feedback terminal, and the first amplifier circuit driven by the feedback terminal of the first amplifier circuit with the second level of the third control signal generates the first control signal with the first level so that the first controllable resistor of the third amplifier circuit is controlled in high-resistance fashion, the second amplifier circuit driven by the feedback terminal of the second amplifier circuit with the second level of the third control signal generates the second control signal with the first level so that the second controllable resistor of the third amplifier circuit is controlled in low-resistance fashion, the output terminal of the third amplifier circuit is connected to the feedback terminal of the first amplifier circuit via a first feedback resistor, and the output terminal of the third amplifier circuit is connected to the feedback terminal of the second amplifier circuit via a second feedback resistor.

3. The integrated circuit as claimed in claim 1, further comprising:

a terminal for applying a supply potential; and a terminal for applying a reference potential, wherein the first and second amplifier circuits are each connected between the terminal for applying the supply potential and the terminal for applying the reference potential.

4. The integrated circuit as claimed in claim 3, wherein the first amplifier circuit includes a first transistor with a drain terminal for generating the first control signal with a gate terminal and a source terminal, the drain terminal of the first transistor of the first amplifier circuit is connected via a first resistor of the first amplifier circuit to the terminal for applying the supply potential and to the control terminal of the first controllable resistor of the third amplifier circuit, the source terminal of the first transistor of the first amplifier circuit is connected to the terminal for applying the reference potential, and the first amplifier circuit generates a level-shifted input signal from the input signal, the level-shifted input signal having a different level of a DC component than the level of the DC component of the input signal, the different level of the DC component of the level-shifted input signal being independent of the level of the DC component of the input signal, the level-shifted input signal of the first amplifier circuit being fed to the gate terminal of the first transistor of the first amplifier circuit.

5. The integrated circuit as claimed in claim 4, wherein the first transistor of the first amplifier circuit has a threshold voltage, and the level of the DC component of the level-shifted input signal of the first amplifier circuit approximately corresponds to a level of the threshold voltage of the first transistor of the first amplifier circuit.

6. The integrated circuit as claimed in claim 4, wherein wherein the first amplifier circuit includes a differentiating element with a capacitor, and the capacitor is connected between the input terminal of the first amplifier circuit and the control terminal of the first transistor of the first amplifier circuit.

7. The integrated circuit as claimed in claim 6, wherein the capacitor of the first amplifier circuit is a second transistor, the second transistor including a drain terminal and a source terminal connected to one another and connected to the gate terminal of the first transistor of the first amplifier circuit.

8. The integrated circuit as claimed in claim 4, wherein the first amplifier circuit includes a second resistor and a third resistor for setting an operating point of the first amplifier circuit, the second resistor of the first amplifier circuit is connected between the terminal for applying the supply potential and the gate terminal of the first transistor of the first amplifier circuit, and the third resistor of the first amplifier circuit is connected between the terminal for applying the reference potential and the gate terminal of the first transistor of the first amplifier circuit.

9. The integrated circuit as claimed in claim 4, wherein the feedback terminal of the first amplifier circuit is connected to the control terminal of the first transistor of the first amplifier circuit.

10. The integrated circuit as claimed in claim 4, wherein the first transistor of the first amplifier circuit is an n-channel field-effect transistor.

11. The integrated circuit as claimed in claim 3, wherein the second amplifier circuit includes a first transistor with a drain terminal for generating the second control signal, a gate terminal, and a source terminal, the drain terminal of the first transistor of the second amplifier circuit is connected via a first resistor to the terminal for applying the reference potential and to the control terminal of the second controllable resistor of the third amplifier circuit, the source terminal of the first transistor of the second amplifier circuit is connected to the terminal for applying the supply potential, the second amplifier circuit generates a level-shifted input signal from the input signal, the level-shifted input signal having a different level of a DC component than the level of the DC component of the input signal, the different level of the DC component of the level-shifted input signal being independent of the level of the DC component of the input signal, and the level-shifted input signal of the second amplifier circuit is fed to the gate terminal of the first transistor of the second amplifier circuit.

12. The integrated circuit as claimed in claim 11, wherein the first transistor of the second amplifier circuit has a threshold voltage, and the level of the DC component of the level-shifted input signal of the second amplifier circuit approximately corresponds to a level of the threshold voltage of the first transistor of the second amplifier circuit.

13. The integrated circuit as claimed in claim 11, wherein the second amplifier circuit includes a differentiating element with a capacitor, and the capacitor is connected between the input terminal of the second amplifier circuit and the control terminal of the first transistor of the second amplifier circuit.

14. The integrated circuit as claimed in claim 13, wherein the capacitor of the second amplifier circuit is a second transistor, the second transistor including a drain terminal and a source terminal connected to one another and connected to the gate terminal of the first transistor of the second amplifier circuit.

15. The integrated circuit as claimed in claim 11, wherein the second amplifier circuit includes a second resistor and a third resistor for setting an operating point of the second amplifier circuit, the second resistor of the second amplifier circuit is connected between the terminal for applying the supply potential and the gate terminal of the first transistor of the second amplifier circuit, and the third resistor of the second amplifier circuit is connected between the terminal for applying the reference potential and the gate terminal of the first transistor of the second amplifier circuit.

16. The integrated circuit as claimed in claim 11, wherein the feedback terminal of the second amplifier circuit is connected to the control terminal of the first transistor of the second amplifier circuit.

17. The integrated circuit as claimed in claim 11, wherein the first transistor of the second amplifier circuit is a p-channel field-effect transistor.

18. The integrated circuit as claimed in claim 3, wherein the first controllable resistor of the third amplifier circuit is connected between the terminal for applying the reference potential and the output terminal of the third amplifier circuit, and the second controllable resistor of the third amplifier circuit is connected between the terminal for applying the supply potential and the output terminal of the third amplifier circuit.

19. The integrated circuit as claimed in claim 3, further comprising:
an output terminal; and
a first and a second inverter circuit, the first and second inverter circuits each connected between the terminal for applying the supply potential and the terminal for applying the reference potential,
wherein the output terminal of the third amplifier circuit is connected to the output terminal of the integrated circuit via the first and second inverter circuits.

20. The integrated circuit as claimed in claim 2, wherein the first level of the first, second, and third control signals are each a low voltage level, and
the second level of the first, second, and third control signals is designed as a high voltage level.

21. The integrated circuit as claimed in claim 1, wherein the first controllable resistor of the third amplifier circuit is an n-channel field-effect transistor, and
the second controllable resistor of the third amplifier circuit is a p-channel field-effect transistor.

22. A method for amplifying an input signal, comprising:
providing an input signal with a high and a low level, the input signal having a DC component;
providing an integrated circuit with a supply potential and a reference potential with a first amplifier circuit and a second amplifier circuit, with a first controllable resistor and a second controllable resistor;
driving an input terminal of the first amplifier circuit and an input terminal of the second amplifier circuit with the high and the low level of the input signal;

generating a level-shifted input signal in the first amplifier circuit with a level of a DC component, the level of the DC component of the level-shifted input signal of the first amplifier circuit approximately corresponding to a level of a threshold voltage of a first transistor of the first amplifier circuit;

generating a level-shifted input signal in the second amplifier circuit with a level of a DC component, the level of the DC component of the level-shifted input signal of the second amplifier circuit approximately corresponding to a level of a threshold voltage of a first transistor of the second amplifier circuit;

generating a first control signal by the first amplifier circuit with a first level and generating a second control signal by the second amplifier circuit with a first level if the input signal has the high level, generating the first control signal by the first amplifier circuit with a second level and generating the second control signal by the second amplifier circuit with a second level if the input signal has the low level;

controlling the first controllable resistor into a low-resistance state when driving the first controllable resistor with the second level of the first control signal;

controlling the second controllable resistor into a high-resistance state when driving the second controllable resistor with the second level of the second control signal;

generating a third control signal with a first level;

controlling the first controllable resistor into a high-resistance state when driving the first controllable resistor with the first level of the first control signal;

controlling the second controllable resistor into a low-resistance state when driving the second controllable resistor with the first level of the second control signal;

generating the third control signal with a second level;

generating an output signal with the level of the reference potential, if the third control signal has the first level; and generating the output signal with the level of the supply potential, if the third control signal has the second level.

23. The method for amplifying an input signal as claimed in claim 22, further comprising:
feeding back the third control signal to a control terminal of the first transistor of the first amplifier circuit; and
feeding back the third control signal to a control terminal of the first transistor of the second amplifier circuit.

* * * * *